United States Patent
Nidhi et al.

(10) Patent No.: US 11,881,511 B2
(45) Date of Patent: Jan. 23, 2024

(54) SUPERLATTICE FINFET WITH TUNABLE DRIVE CURRENT CAPABILITY

(71) Applicant: Intel Corporation, Santa Clara, CA (US)

(72) Inventors: Nidhi Nidhi, Hillsboro, OR (US); Rahul Ramaswamy, Portland, OR (US); Sansaptak Dasgupta, Hillsboro, OR (US); Han Wui Then, Portland, OR (US); Marko Radosavljevic, Portland, OR (US); Johann C. Rode, Hillsboro, OR (US); Paul B. Fischer, Portland, OR (US); Walid M. Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 963 days.

(21) Appl. No.: 16/226,162

(22) Filed: Dec. 19, 2018

(65) Prior Publication Data
US 2020/0203484 A1 Jun. 25, 2020

(51) Int. Cl.
*H01L 29/778* (2006.01)
*H01L 29/15* (2006.01)
*H01L 29/205* (2006.01)
*H01L 29/66* (2006.01)
*H01L 29/78* (2006.01)
*H01L 29/20* (2006.01)

(52) U.S. Cl.
CPC ........ *H01L 29/155* (2013.01); *H01L 29/2003* (2013.01); *H01L 29/205* (2013.01); *H01L 29/66462* (2013.01); *H01L 29/7783* (2013.01); *H01L 29/785* (2013.01)

(58) Field of Classification Search
CPC ......... H01L 29/66431; H01L 29/66462; H01L 29/778–7789
See application file for complete search history.

(56) References Cited

U.S. PATENT DOCUMENTS

| | | | |
|---|---|---|---|
| 5,105,241 A * | 4/1992 | Ando | H01L 29/7783 257/E29.249 |
| 9,419,121 B1 * | 8/2016 | Teo | H01L 29/778 |
| 2002/0185655 A1 * | 12/2002 | Fahimulla | B82Y 10/00 257/E29.05 |
| 2012/0235156 A1 * | 9/2012 | Kuraguchi | H01L 29/7787 257/E29.264 |
| 2013/0105812 A1 * | 5/2013 | Ishigaki | H01L 29/4236 257/192 |
| 2015/0021662 A1 * | 1/2015 | Basu | H01L 29/7784 438/285 |
| 2015/0295072 A1 * | 10/2015 | Rezanezhad Gatabi | H01L 29/423 257/29 |
| 2015/0303292 A1 * | 10/2015 | Shibata | H01L 29/2003 257/76 |

(Continued)

*Primary Examiner* — Eric A. Ward
(74) *Attorney, Agent, or Firm* — Schwabe Williamson & Wyatt, P.C.

(57) ABSTRACT

A transistor is disclosed. The transistor includes a substrate, a superlattice structure that includes a plurality of heterojunction channels, and a gate that extends to one of the plurality of heterojunction channels. The transistor also includes a source adjacent a first side of the superlattice structure and a drain adjacent a second side of the superlattice structure.

14 Claims, 6 Drawing Sheets

(56) References Cited

U.S. PATENT DOCUMENTS

2015/0372126 A1* 12/2015 Bunin .................. H01L 29/417
  257/194
2016/0126340 A1*  5/2016 Nechay ............ H01L 29/66462
  257/20
2019/0267454 A1*  8/2019 Matioli ................ H01L 29/402

* cited by examiner

SUPERLATTICE FINFET WITH TUNABLE DRIVE CURRENT CAPABILITY

TECHNICAL FIELD

Embodiments of the disclosure pertain to FINFETs with tunable drive current capability and, in particular, to superlattice FINFETs with tunable drive current capability.

BACKGROUND

GaN transistors are candidates for use in fifth generation (5G) radio frequency (RF) products. In order to achieve high frequency performance, a scaling of the gate length of GaN transistors is required. Such scaling requires FINFET like device architecture to control short channel effects. However, FINFET architectures have the disadvantage of producing quantized values of current that are based on the number of FINs that are in the transistor. Thus, the drive current can only be adjusted in discrete increments based on the number of FINs and not as a continuous variable. However, for analog circuit applications, the ability to fine tune drive current is needed for maximal performance.

In a conventional approach a back-barrier design is used to modulate short channel effects. For shorter gate lengths, this may prove challenging because back-barrier devices are still essentially planar devices and require a sufficiently thin polarization barrier to provide an aspect ratio of approximately 10. For gate lengths that are shorter than this threshold, a FINFET like solution is required. However, as discussed above, FINFET like architectures suffer from a discretization of drive currents that is characterized by large steps between drive current values. The large steps between drive current values significantly reduce the ability to fine tune drive current in analog circuits.

DESCRIPTION OF THE EMBODIMENTS

A FINFET with tunable drive current capability is described. It should be appreciated that although embodiments are described herein with reference to example FINFETs with tunable drive current capability implementations, the disclosure is more generally applicable to FINFETs with tunable drive current capability implementations as well as other type FINFETs with tunable drive current capability implementations. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

GaN transistors are candidates for use in 5G RF products. In order to achieve high frequency performance, a scaling of the gate length of GaN transistors is required. Such scaling requires FINFET like device architecture to control short channel effects. However, FINFET architectures have the disadvantage of producing quantized values of current that are based on the number of FINs that are in the transistor. Thus, the drive current can only be adjusted in discrete increments based on the number of FINs and not as a continuous variable. However, for analog circuit applications, the ability to fine tune drive current is needed for maximal performance.

In a conventional approach a back-barrier design is used to modulate short channel effects. For shorter gate lengths, this may prove challenging because back-barrier devices are still essentially planar devices and require a sufficiently thin polarization barrier to provide an aspect ratio of approximately 10. For gate lengths that are shorter than this threshold a FINFET like solution is required. However, as discussed above, FINFET like architectures suffer from a discretization of drive currents that is characterized by large steps between drive current values. The large steps between drive current values significantly reduce the ability to fine tune drive current in analog circuits.

A process and device that addresses the shortcomings of previous approaches is disclosed herein. As part of the disclosed approach, a FINFET device is provided that includes a superlattice stack that facilitates the provision of finer drive current step sizes. In an embodiment, the superlattice stack can include alternating layers of different types of materials. In an embodiment, the superlattice stack can include alternating layers of different types of semiconductor materials. In an embodiment, the superlattice stack can include alternating layers of AlN and GaN. In other embodiments, the superlattice stack can be formed from alternating layers of other types of materials. In an embodiment, the wrap-around gate of the FINFET is used to facilitate the access of all the superlattice channels. For example, for analog circuit applications, the gate can be configured to extend to any depth into the superlattice structure and overlap any number of fins such that finer drive current step sizes can be provided. As discussed, for scaled GaN devices, conventional FINFETs present significant shortcomings related to bias/drive current tuning that correspond to the relationship between the drive current and discrete fins. In an embodiment, such shortcomings are addressed as the disclosed superlattice structure provides an additional mechanism for tuning drive current strength that operates cooperatively with fin based tuning capability to enable a more fine grained setting of drive current strength than is provided using previous approaches. Additionally, in planar device embodiments, the superlattice structure can be combined with a trigate design to provide enhanced gate control, e.g., at the lowest channel.

Figure 1A:
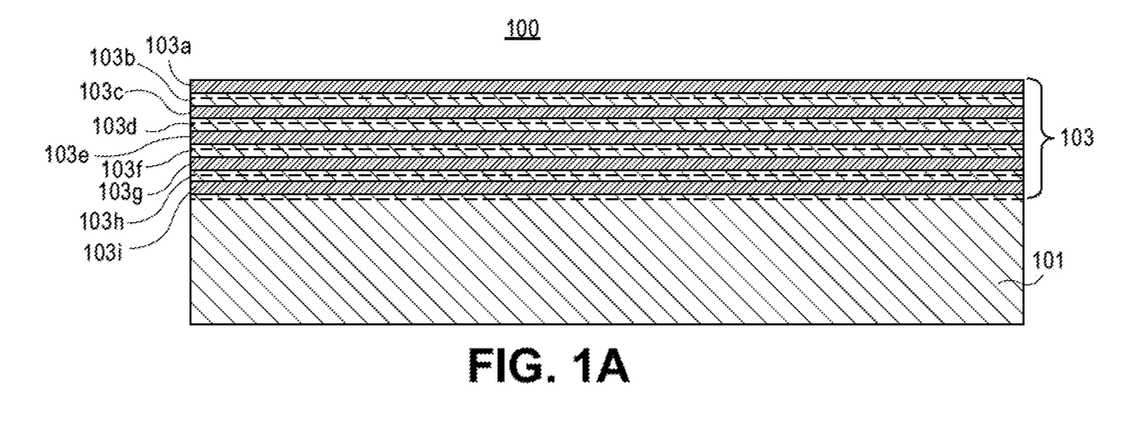
FIG. 1A is an illustration of a cross-section of a semiconductor structure that includes a superlattice according to an embodiment.

FIG. 1A is an illustration of a cross-section of a semiconductor structure 100 according to an embodiment. In FIG. 1A semiconductor structure 100 shows substrate 101 and superlattice structure 103. In an embodiment, the superlattice structure includes AlN layers 103a, 103c, 103e, 103g, and 103i and GaN layers 103b, 103d, 103f and 103h.

Referring to FIG. 1A, the superlattice structure 103 is formed on the substrate 101. In the superlattice structure 103, the AlN layer 103i is formed on the surface of the substrate 101, the GaN layer 103h is formed on the AlN layer 103i, the AlN layer 103g is formed on the GaN layer 103h, the GaN layer 103f is formed on the AlN layer 103g, the AlN layer 103e is formed on the GaN layer 103f, the GaN layer 103d is formed on the AlN layer 103e, the AlN layer 103c is formed on the GaN layer 103d, the GaN layer 103b is formed on the AlN layer 103c, and the AlN layer 103a is formed on the GaN layer 103b.

Referring to FIG. 1, the AlN/GaN superlattice stack utilizes the spontaneous and piezoelectric polarization in group III nitrides to induce the formation of several 2-dimensional electron gas channels. In an embodiment, the stack undergoes FINFET processing with source and drain epitaxial regrowth and gate and contact formation. In an embodiment, the gate recess can be controlled for various device types to control the drive current per fin as shown below. For example, the drive current can be tuned per fin by step size=drive current per fin/(number of channels). In an embodiment, the drive current step size is inversely proportional to the number of channels. Consequently, by using careful epitaxial stack engineering, the setting of the drive current can be finely tuned by device designers to desired levels.

Figure 1B:
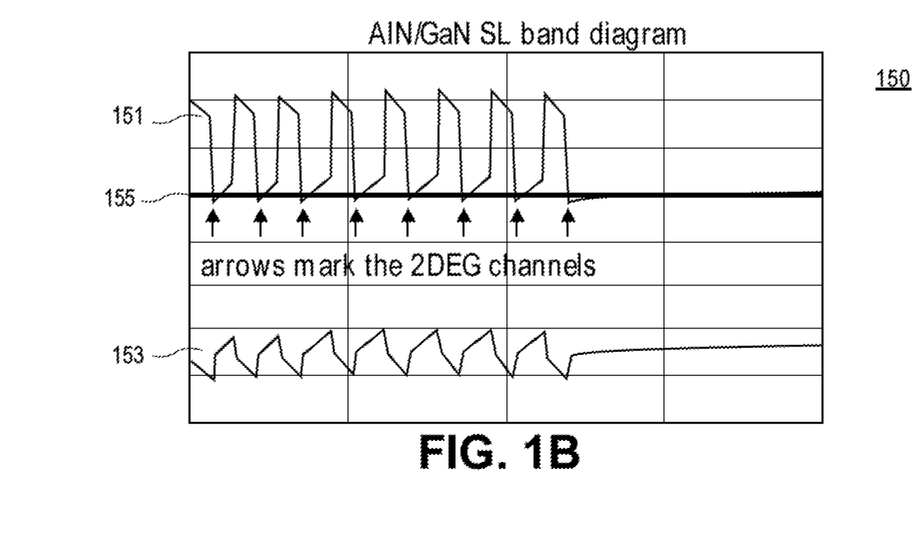
FIG. 1B illustrates an AlN/GaN band diagram according to an embodiment.

FIG. 1B is a band diagram 150 that shows plots of the energy of the fermi level, the conduction band, and the valence band as a function of superlattice depth according to an embodiment. In FIG. 1B the band diagram 150 includes conduction band trace 151, valence band trace 153 and fermi level trace 155. Referring to FIG. 1B, the high points of the conduction band trace 151 correspond to wide bandgap AlN layers. At the interface between the AlN layers and the GaN layers, as indicated by the conduction band trace 151, the conduction band energy crosses the fermi level, and electron gas is created. Referring to FIG. 1B, the conduction band trace 151 shows that at the interfaces between AlN and GaN in the superlattice, the energy of the electron gas that is produced by the heterojunctions rises far above the fermi level throughout the lattice structure (e.g., corresponding to each of the superlattice interfaces). In FIG. 1B, the arrows identify positions that correspond to the 2DEG channels of the of the superlattice structure 103. FIG. 1B shows that in embodiments a high number of 2DEG channels can be formed that enable tuning to between step levels that corresponds to the number of 2DEG channels that are provided.

Figure 2A:
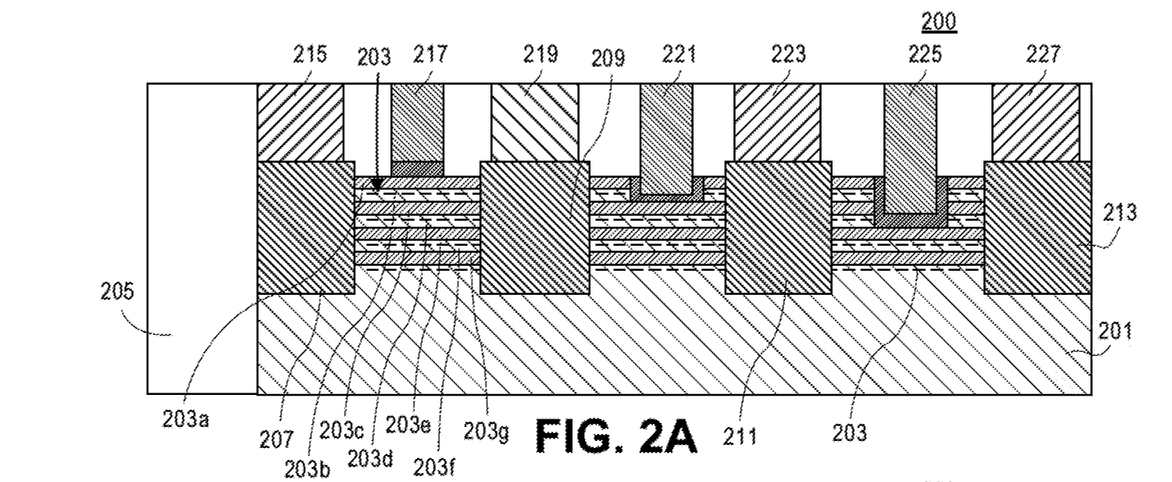
FIG. 2A is an illustration of a cross-section of a semiconductor structure that includes a FINFET with tunable drive current capability according to an embodiment.

FIG. 2A is an illustration of a cross-section of a semiconductor structure 200 that includes devices with a superlattice structure according to an embodiment. In FIG. 2A semiconductor structure 200 includes substrate 201, superlattice structure 203, dielectric 205, source 207, drain 209, source 211, drain 213, source contact 215, gate 217, drain contact 219, gate 221, source contact 223, gate 225 and drain contact 227. The superlattice structure includes AlN layers 203a, 203c, 203e, and 203g, and GaN layers 203b, 203d and 203f.

Referring to FIG. 2A, the superlattice structure 203 is formed on the substrate 201. The source 207, the drain 209, the source 211, and the drain 213 are formed in, and extend above, the upper portion of the substrate 201. The gate 217 is formed on a part of the superlattice structure 203 that is between the source 207 and the drain 209. The gate 221 is formed on a part of the superlattice structure 203 that is between the drain 209 and the source 211. The gate 225 is formed on a part of the superlattice structure 203 that is between the source 211 and the drain 213. The dielectric 205 is formed adjacent the sides of the semiconductor structure 200 and between the source contact 215 and the gate 217, the gate 217 and the drain contact 219, the drain contact 219 and the gate 221, the gate 221 and the source contact 223, the source contact 223 and the gate 225, and the gate 225 and the drain contact 227. In an embodiment, a gate dielectric can be formed below the bottom surface of the gate structures as shown in FIG. 2A. In other embodiments, a gate dielectric may not be formed below the bottom surface of the gate structures.

In an embodiment, the superlattice structure 203 can be formed from AlN and GaN layers. In other embodiments, the superlattice structure 203 can be formed from other materials. For example, the superlattice structure 203 can include any type polarization layers as long as multiple channels are formed. In an embodiment, the superlattice structure 203 can include any polarization layers of the form AlxInyGa1-x-yN as long as multiple channels are formed. In an embodiment, the dielectric 205 can be formed from SiO2. In other embodiments, the dielectric 205 can be formed from other materials. In an embodiment, the source 207, the drain 209, the source 211 and the drain 213 can be formed from InGaN. In other embodiments, the source 207, the drain 209, the source 211 and the drain 213 can be formed from other materials. In an embodiment, the source contact 215 and the source contact 223 can be formed from Ni, Pt, TiN, TaN, W or TiAlN. In other embodiments, the source contact 215 and the source contact 223 can be formed from other materials. In an embodiment, the drain contact 219 and the drain contact 227 can be formed from Ni, Pt, TiN, TaN, W or TiAlN. In other embodiments, the drain contact 219 and the drain contact 227 can be formed from other materials. In an embodiment, the gate 217, the gate 221 and the gate 225 can be formed from Ti, Ta, or Al. In other embodiments, the gate 217, the gate 221 and the gate 225 can be formed from other materials.

In operation, such as in RF applications, the FINFET like architecture of the semiconductor structure 200 provides control of short channel effects while the access of all the superlattice channels by the wrap-around gate of the FINFET enables a fine grained adjustment of the drive current that provides a level of tuning that extracts maximal device performance. The drive current is controlled by inducing current flow in 2-dimensional electron gas channels. As discussed above, for analog circuit applications, the gates 217, 221 and 225 can be configured to extend to any depth into the superlattice structure 203 and overlap any number of fins such that finer drive current step sizes can be achieved. Thus, in an embodiment, the superlattice structure 203 provides an additional mechanism for tuning drive current strength that operates cooperatively with fin based tuning capability to enable a more fine grained setting of drive current strength than is possible using previous approaches.

Figure 2B:
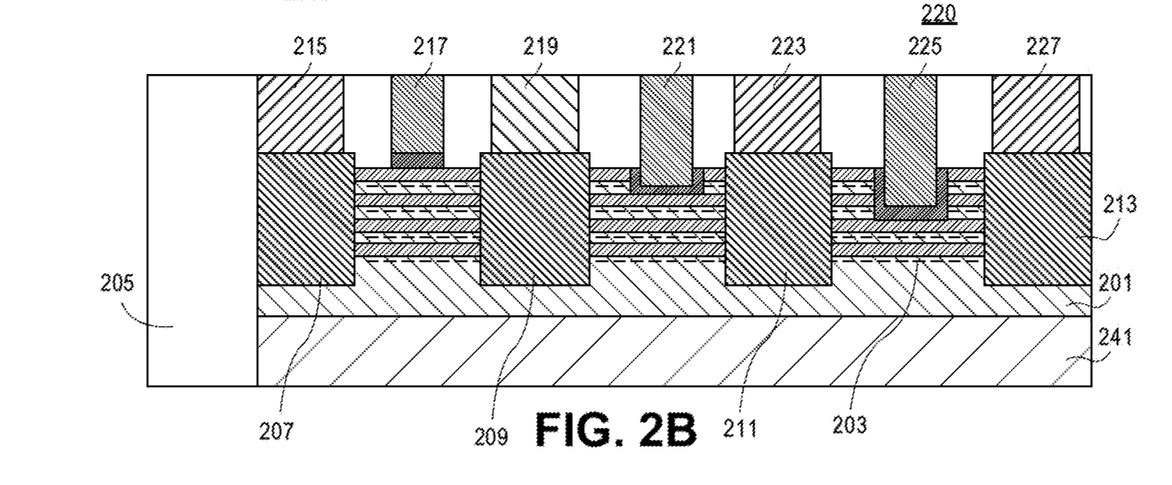
FIG. 2B is an illustration of a cross-section of a semiconductor structure with a back barrier that includes a FINFET with tunable drive current capability according to an embodiment.

FIG. 2B is an illustration of a cross-section of a semiconductor structure 220 with a back barrier that includes a FINFET with tunable drive current capability according to an embodiment. In an embodiment, the semiconductor structure 220 includes a similar structure including similar components having a similar function as described with reference to FIG. 2A. These components will not be described again here for purposes of clarity and brevity. In addition to the structures described with reference to FIG. 2A, semiconductor structure 220 includes backbarrier 241. In an embodiment, the backbarrier 241 is coupled to the backside of the substrate 201. In an embodiment, the backbarrier 241 can be used to provide short channel effect improvements in addition to those provided by the herein described superlattice structure. It should be appreciated that in an embodiment, the semiconductor structures 200 and 220 shown in FIGS. 2A and 2B can be formed from various crystal orientations of GaN and modulation doped FETs.

Figure 3:
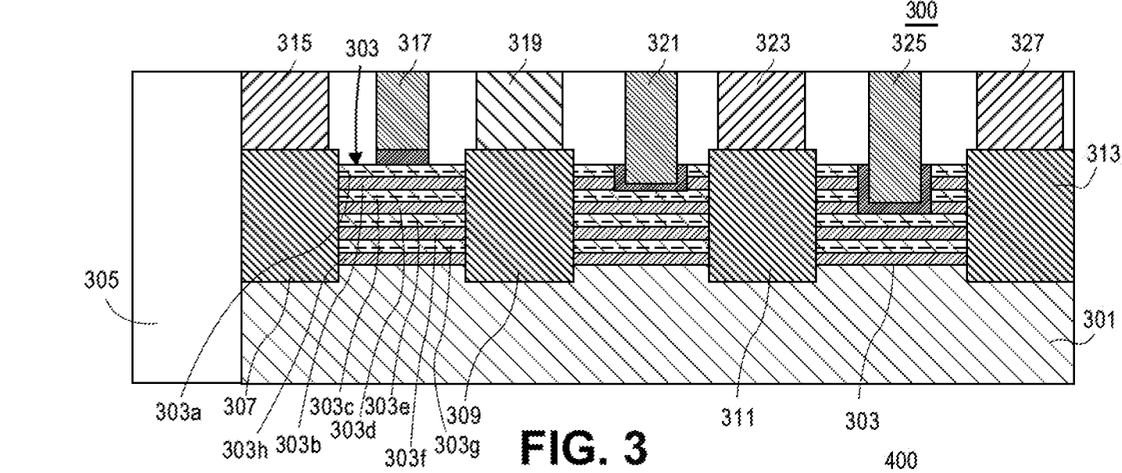
FIG. 3 is an illustration of a cross-section of a semiconductor structure that includes a FINFET with tunable drive current capability according to an embodiment.

FIG. 3 is an illustration of a cross-section of a semiconductor device 300 that includes a superlattice structure according to an embodiment. In the FIG. 3 embodiment, the principles described with reference to FIG. 2A, are applied to PMOS semiconductor device 300. In the FIG. 3A embodiment, the superlattice stack 301 is terminated with GaN on top. In FIG. 3A semiconductor device 300 includes substrate 301, superlattice structure 303, dielectric 305, source 307, drain 309, source 311, drain 313, source contact 315, gate 317, drain contact 319, gate 321, source contact 323, gate 325 and drain contact 327. In an embodiment, the superlattice structure 303 includes GaN layers 303a, 303c, 303e and 303g, and AlN layers 303b, 303d, 303f and 303h.

In FIG. 3 the superlattice structure 303 is formed on the substrate 301. The source 307, the drain 309, the source 311, and the drain 313 are formed in and extend above the upper portion of the substrate 301. The gate 317 is formed on a part of the superlattice structure 303 that is between the source 307 and the drain 309. The gate 321 is formed on a part of the superlattice structure 303 that is between the drain 309 and the source 311. The gate 325 is formed on a part of the superlattice structure 303 that is between the source 311 and the drain 313. The dielectric 305 is formed adjacent the sides of the semiconductor device 300 and between the source contact 315 and the gate 317, the gate 317 and the drain contact 319, the drain contact 319 and the gate 321, the gate 321 and the source contact 323, the source contact 323 and the gate 325, and the gate 325 and the source contact 327.

In an embodiment, the superlattice structure 303 can be formed from AlN and GaN layers. In other embodiments, the superlattice structure 303 can be formed from other materials. In an embodiment, the dielectric 305 can formed from SiO2. In other embodiments, the dielectric 305 can be formed from other materials. In an embodiment, the source 307, the drain 309, the source 311 and the drain 313 can be formed from InGaN. In other embodiments, the source 307, the drain 309, the source 311 and the drain 313 can be formed from other materials. In an embodiment, the source contact 315 and the source contact 323 can be formed from Ni, Pt, TiN, TaN, W or TiAlN. In other embodiments the source contact 315 and the source contact 323 can be formed from other materials. In an embodiment, the drain contact 319 and the drain contact 327 can be formed from Ni, Pt, TiN, TaN, W or TiAlN. In other embodiments, the drain contact 319 and the drain contact 327 can be formed from other material. In an embodiment, the gate 317, the gate 321 and the gate 325 can be formed from Pt, Co or Ni. In other embodiments, the gate 317, the gate 321 and the gate 325 can be formed from other materials.

In operation, such as in RF applications, the FINFET like architecture of the semiconductor structure 300 provides control of short channel effects while the access of all the superlattice channels by the wrap-around gate of the FINFET enables a fine grained adjustment of the drive current that provides a level of tuning that extracts maximal device performance. The drive current is controlled by inducing current flow in 2-dimensional hole gas channels. As discussed above, for analog circuit applications, the gate can be configured to extend to any depth into the superlattice structure 303 and overlap any number of fins such that finer drive current step sizes can be achieved. Thus, the superlattice structure provides an additional mechanism for tuning drive current strength that operates cooperatively with fin based tuning capability to enable a finer grained setting of drive current strength than is possible using previous approaches.

Figure 4:
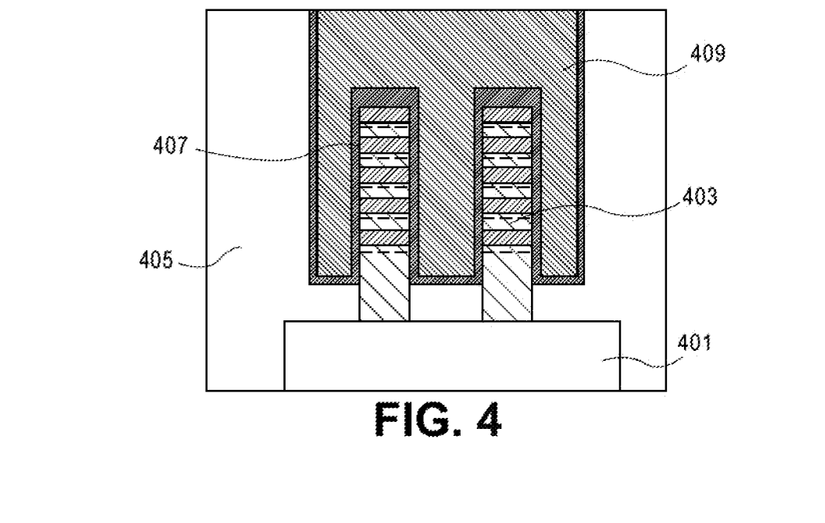
FIG. 4 is an illustration of a cross-sectional view cut along the gate direction of a portion of a semiconductor structure such as is shown in FIG. 2A.

FIG. 4 shows a cross-sectional view cut along the gate direction of a portion of a semiconductor structure 400 such as is shown in FIG. 2A. FIG. 4 shows substrate 401, superlattice structure 403, interlayer dielectric 405, gate dielectric 407 and gate metal 409. Referring to FIG. 4, the gate metal 409 rests on gate dielectric 407. In an embodiment, the interlayer dielectric 405 is left between the gate metal 409 and the substrate (e.g., GaN material) to prevent channel formation in the isolation area.

Figure 5:
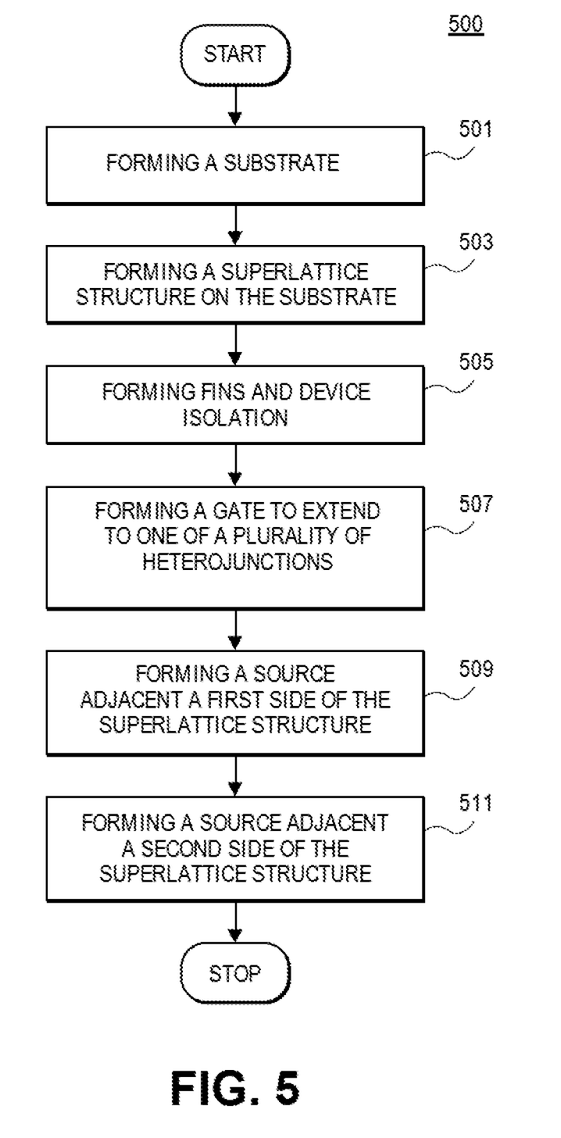
FIG. 5 is a flowchart of a method of forming a FINFET with tunable drive current capability according to an embodiment.

FIG. 5 is a flowchart of a method according to an embodiment. Referring to FIG. 5, the method includes, at 501, forming a substrate. At 503, forming a superlattice structure on the substrate. In an embodiment, the superlattice structure includes a plurality of heterojunction channels. At 505, forming fins and device isolation. At 507, forming a gate to extend to one of the plurality of heterojunction channels. As discussed above, for analog circuit applications, the gate can be formed (such as by etching a space for the gate and forming a gate conductor in the space) to extend to any depth into the superlattice structure and to overlap any number of fins such that fine drive current step sizes can be achieved. Thus, in an embodiment, the superlattice structure provides an additional mechanism for tuning drive current strength that operates cooperatively with fin based tuning capability to enable a more fine grained setting of drive current strength than is possible using previous approaches. At 509, forming a source adjacent a first side of the superlattice structure. At 511, forming a drain adjacent a second side of the superlattice structure. The source and drain contacts are formed after the source and drain regions are formed. In an embodiment, a backbarrier is formed on the substrate. In an embodiment, a capping layer can be formed on the gate. In an embodiment, a gate is formed to produce a drive current step size that is equal to the drive current per fin (number of channels below the gate). In an embodiment, the gate is formed to produce a drive current step size that is inversely proportional to the number of channels below the gate. In an embodiment, the heterojunctions are formed from AlN and GaN.

Implementations of embodiments of the invention may be formed or carried out on a substrate, such as a semiconductor substrate. In one implementation, the semiconducsubstrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors. In addition, Schottky transistors can be fabricated using the processes described herein. For example, a Schottky transistor can be formed with a metal gate where the metal is formed on semiconductor fins without intervening oxide.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 6:
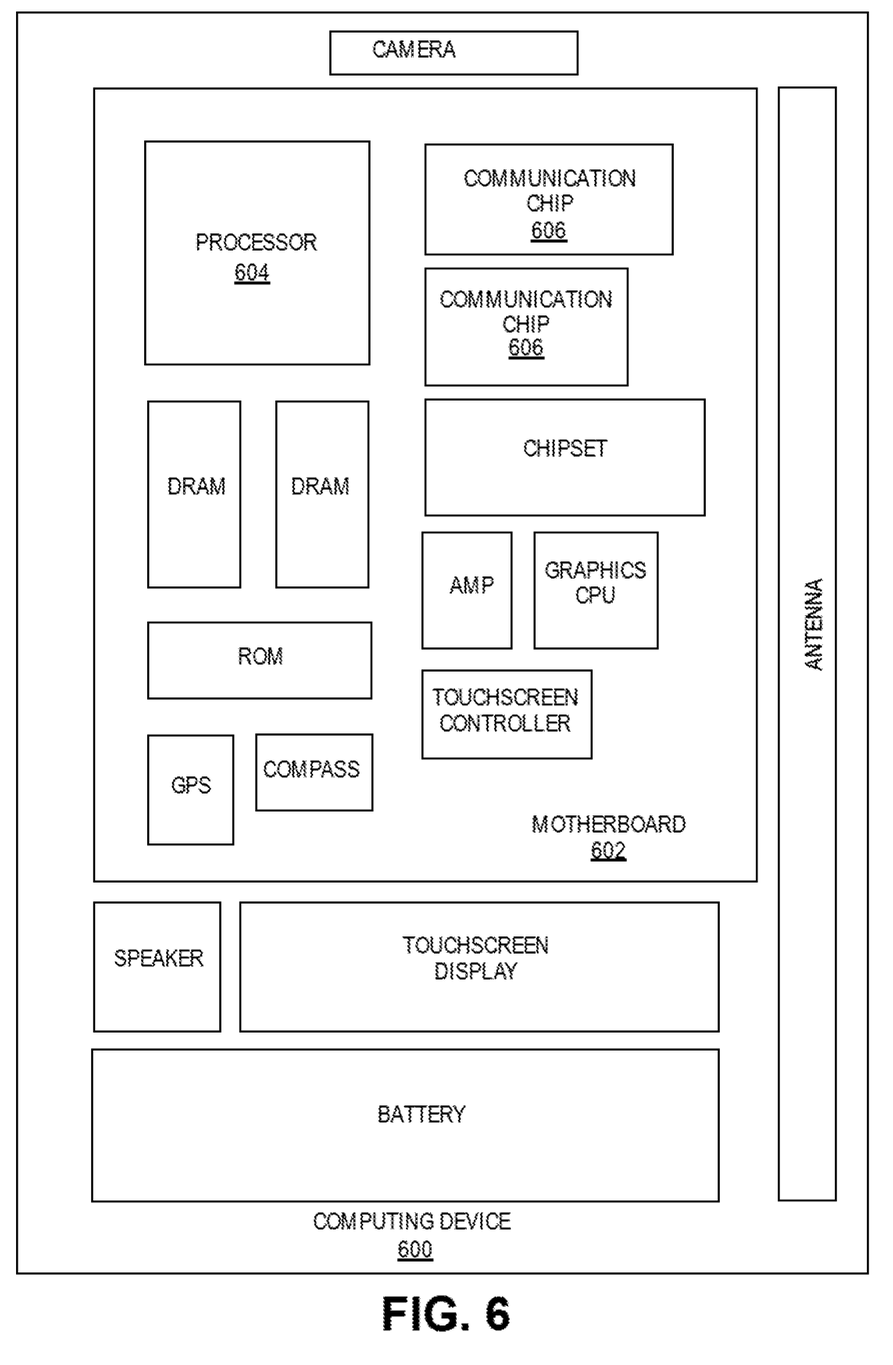
FIG. 6 illustrates a computing device in accordance with one implementation of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as MOS-FET transistors built in accordance with implementations of the invention.

In further implementations, another component housed within the computing device 600 may contain an integrated circuit die that includes one or more devices, such as MOS-FET transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
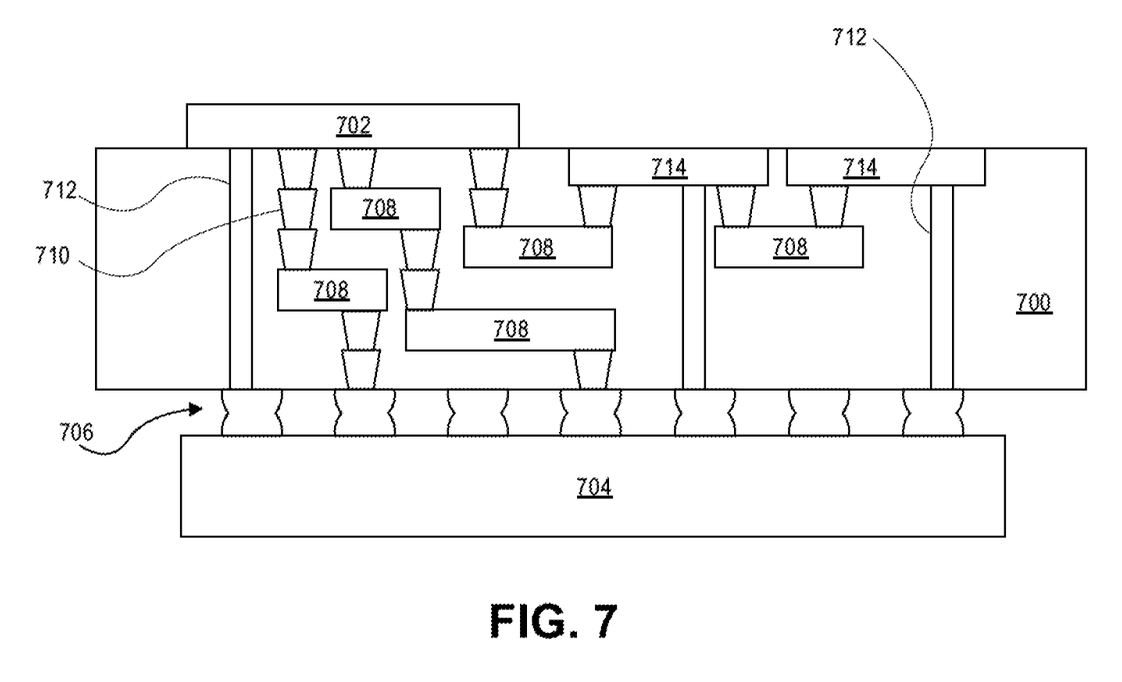
FIG. 7 illustrates an interposer that includes one or more embodiments of the invention.

FIG. 7 illustrates an interposer 700 that includes one or more embodiments of the invention. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the invention, apparatuses or processes disclosed herein may be used in the fabrication of interposer 700.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

A transistor, including a substrate, a superlattice structure coupled to the substrate that includes a plurality of heterojunction channels, a gate that extends to one of the plurality of heterojunction channels, a source adjacent a first side of the superlattice structure, and a drain adjacent a second side of the superlattice structure.

Example Embodiment 2

The transistor of example embodiment 1, further comprising a backbarrier coupled to the substrate.

Example Embodiment 3

The transistor of example embodiment 1, further comprising a capping layer.

Example Embodiment 4

The transistor of example embodiment 1, wherein the gate produces a drive current step size that is equal to the drive current per fin divided by a number of channels below the gate.

Example Embodiment 5

The transistor of example embodiment 1, wherein the gate produces a drive current step size that is inversely proportional to a number of channels below the gate.

Example Embodiment 6

The transistor of example embodiment 1, wherein the heterojunctions are formed with AlN and GaN.

Example Embodiment 7

The transistor of example embodiment 1, 2, 3, 4, 5, or 6 wherein a gate dielectric covers the bottom of the gate.

Example Embodiment 8

A semiconductor structure including a substrate, a superlattice structure that includes a plurality of heterojunction channels on the substrate, a first gate that extends to one of the plurality of heterojunction channels, and a second gate that extends to a second one of the plurality of heterojunction channels.

Example Embodiment 9

The semiconductor structure of example embodiment 8, further comprising a backbarrier coupled to the substrate.

Example Embodiment 10

The semiconductor structure of example embodiment 8, further comprising a capping layer.

Example Embodiment 11

The semiconductor structure of example embodiment 8, wherein the first gate and the second gate produce a drive current step size that is equal to the drive current per fin divided by a number of channels below the first gate and the second gate.

Example Embodiment 12

The semiconductor structure of example embodiment 8, wherein the first gate and the second gate produce a drive current step size that is inversely proportional to a number of channels below the first gate and the second gate.

Example Embodiment 13

The semiconductor structure of example embodiment 8, wherein the heterojunctions are formed with AlN and GaN.

Example Embodiment 14

The semiconductor structure of example embodiment 8, 9, 10, 11, 12 or 13 wherein a gate dielectric covers the bottom of the first gate and the second gate.

Example Embodiment 15

A method, including forming a substrate, forming a superlattice structure on the substrate that includes a plurality of heterojunction channels, forming a gate to extend to one of the plurality of heterojunction channels, forming a source adjacent a first side of the superlattice structure, and forming a drain adjacent a second side of the superlattice structure.

Example Embodiment 16

The method of example embodiment 15, further comprising forming a backbarrier on the substrate.

Example Embodiment 17

The method of example embodiment 15, further comprising forming a capping layer.

Example Embodiment 18

The method of example embodiment 15, wherein the gate is formed to produce a drive current step size that is equal to the drive current per fin divided by the number of channels below the gate.

Example Embodiment 19

The method of example embodiment of claim 15, wherein the gate is formed to produce a drive current step size that is inversely proportional to the number of channels below the gate.

Example Embodiment 20

The method of example embodiment of claim 15, 16, 17, 18 or 19 wherein the heterojunctions are formed with AlN and GaN.

What is claimed is:

1. A transistor, comprising:
 a substrate;
 a superlattice structure on the substrate that includes a plurality of heterojunction channels;
 a gate that extends to one of the plurality of heterojunction channels and not entirely through the superlattice structure, wherein the gate produces a drive current step size that is equal to a drive current of the superlattice structure divided by a number of channels below the gate;
 a first source or drain structure immediately adjacent a first side of the gate, the first source or drain structure extending through the superlattice structure; and
 a second source or drain structure immediately adjacent a second side of the gate, the second source or drain structure extending through the superlattice structure, and the second source or drain structure having a bottommost surface at a same level as a bottommost surface of the first source or drain structure.

2. The transistor of claim 1, further comprising a backbarrier coupled to the substrate.

3. The transistor of claim 1, further comprising a gate capping layer.

4. The transistor of claim 1, wherein the gate produces a drive current step size that is inversely proportional to a number of channels below the gate.

5. The transistor of claim 1, wherein the heterojunctions are formed with AlN and GaN.

6. The transistor of claim 1, wherein a gate dielectric covers the bottom of the gate.

7. A semiconductor structure, comprising:
 a substrate;
 a superlattice structure that includes a plurality of heterojunction channels on the substrate;
 a first gate that extends to one of the plurality of heterojunction channels;
 a second gate that extends to a different one of the plurality of heterojunction channels;
 a first source or drain structure immediately adjacent a first side of the first gate, the first source or drain structure extending through the superlattice structure;
 a second source or drain structure immediately between a second side of the first gate and a first side of the second gate, the second source or drain structure extending through the superlattice structure, and the second source or drain structure having a bottommost surface at a same level as a bottommost surface of the first source or drain structure; and
 a third source or drain structure immediately adjacent a second side of the second gate, the third source or drain structure extending through the superlattice structure, and the third source or drain structure having a bottommost surface at a same level as the bottommost surface of the second source or drain structure.

8. The semiconductor structure of claim 7, further comprising a backbarrier coupled to the substrate.

9. The semiconductor structure of claim 7, further comprising a gate capping layer.

10. The semiconductor structure of claim 7, wherein the first gate and the second gate produce a drive current step size that is equal to a drive current of the superlattice structure divided by a number of channels below the first gate and the second gate.

11. The semiconductor structure of claim 7, wherein the first gate and the second gate produce a drive current step size that is inversely proportional to a number of channels below the first gate and the second gate.

12. The semiconductor structure of claim 7, wherein the heterojunctions are formed with AlN and GaN.

13. The semiconductor structure of claim 7, wherein a gate dielectric covers the bottom of the first gate and the second gate.

14. A transistor, comprising:
 a substrate;
 a superlattice structure on the substrate that includes a plurality of heterojunction channels;
 a gate that extends to one of the plurality of heterojunction channels and not entirely through the superlattice structure, wherein the gate produces a drive current step size that is inversely proportional to a number of channels below the gate;
 a first source or drain structure immediately adjacent a first side of the gate, the first source or drain structure extending through the superlattice structure; and
 a second source or drain structure immediately adjacent a second side of the gate, the second source or drain structure extending through the superlattice structure, and the second source or drain structure having a bottommost surface at a same level as a bottommost surface of the first source or drain structure.

* * * * *